US005712969A

United States Patent [19]

Zimmermann et al.

[11] Patent Number: 5,712,969

[45] Date of Patent: Jan. 27, 1998

[54] METHOD FOR COMPLETELY REPROGRAMMING AN ERASABLE, NON-VOLATILE MEMORY

[75] Inventors: Jürgen Zimmermann, Vaihingen; Walter Grote, Markgröningen, both of Germany

[73] Assignee: Robert Bosch GmbH, Stuttgart, Germany

[21] Appl. No.: 553,685

[22] PCT Filed: Sep. 10, 1994

[86] PCT No.: PCT/DE94/01040

§ 371 Date: Nov. 30, 1995

§ 102(e) Date: Nov. 30, 1995

[87] PCT Pub. No.: WO95/08824

PCT Pub. Date: Mar. 30, 1995

[30] Foreign Application Priority Data

Sep. 24, 1993 [DE] Germany .......................... 43 32 499.1

[51] Int. Cl.[6] .......................................... G06F 11/20

[52] U.S. Cl. ................................ 395/182.03; 395/185.01

[58] Field of Search ......................... 395/182.03, 182.01, 395/185.01, 182.04, 182.05; 371/40.4; 364/244.4

[56] References Cited

U.S. PATENT DOCUMENTS

| | | | |
|---|---|---|---|
| 4,321,667 | 3/1982 | Robbins et al. | 395/182.03 |
| 4,791,661 | 12/1988 | Donaldson et al. | 379/96 |
| 4,897,630 | 1/1990 | Nykerk | 340/426 |
| 5,263,152 | 11/1993 | Smith et al. | 395/182.03 |
| 5,278,759 | 1/1994 | Berra et al. | 364/424.01 |
| 5,327,531 | 7/1994 | Bealkowski et al. | 395/182.04 |
| 5,473,753 | 12/1995 | Wells et al. | 395/182.03 |
| 5,487,161 | 1/1996 | Koenck et al. | 395/442 |
| 5,511,211 | 4/1996 | Akao et al. | 395/800 |
| 5,564,032 | 10/1996 | Aota et al. | 395/430 |
| 5,619,250 | 4/1997 | McClellan et al. | 348/10 |

OTHER PUBLICATIONS

IBM Technical Disclosure Bulletin, "ROS code Integrity Protection", vol. 3, pp. 434–435, Nov. 1990.

*Primary Examiner*—Robert W. Beausoliel, Jr.
*Assistant Examiner*—Scott T. Baderman
*Attorney, Agent, or Firm*—Michael J. Striker

[57] ABSTRACT

A method for completely reprogramming an erasable, non-volatile memory (12) in a control device (10) is presented. The control device (10) has at least one central unit (11), a volatile memory (13), an erasable, non-volatile memory (12) and also input/output circuits (15). The data to be programmed are transferred from an external electronic device (18), such as a personal computer for example, to the control device (10). The control device then programs the received data itself into the erasable, non-volatile memory. With the method, the erasable, non-volatile memory (12) is divided into two areas (20, 21) that can be erased and programmed separately. Before the actual programming operation a programming module is written in each case into each area (20, 21). To reprogram the erasable, non-volatile memory (12), the programming module is written into at least one of the areas (20, 21) that can be erased and programmed separately. The programming of one of the two areas (20, 21) takes place only if the programming module is written in the other of the two areas (20, 21) that can be erased and programmed separately.

9 Claims, 2 Drawing Sheets

METHOD FOR COMPLETELY REPROGRAMMING AN ERASABLE, NON-VOLATILE MEMORY

BACKGROUND OF THE INVENTION

The present invention relates to methods for complete reprogramming of an erasable, nonvolatile memory and, more particularly, to methods for complete reprogramming of an erasable, nonvolatile memory in a motor vehicle control device.

Methods are known for complete reprogramming of an erasable, nonvolatile memory in a control device having at least one central processing unit, a volatile memory and input/output circuits as well as the erasable, nonvolatile memory. These methods include transferring data to be programmed in the control device from an external electronic device and executing a programing module for programming the erasable, nonvolatile memory in the central processing unit.

A method for completely reprogramming an erasable, non-volatile memory is already known from WO 80/02881. In this method the erasable, non-volatile memory (EPROM) is contained on the chip of a microcomputer. The ROM of the microcomputer contains a programming module for programming. To program the erasable, non-volatile memory (EPROM), the microcomputer is connected via a serial interface to a data terminal. The microcomputer then receives the data to be programmed from the terminal. The microcomputer uses the programming module stored in the ROM for programming the erasable, non-volatile memory (EPROM).

SUMMARY OF THE INVENTION

It is an object of the present invention to provide an improved method for completely reprogramming an erasable, nonvolatile memory in a control device, especially the control device of a motor vehicle.

These objects, and others which will become more apparent hereinafter, are attained in a method for complete reprogramming of an erasable, nonvolatile memory in a control device having at least one central processing unit, a volatile memory and input/output circuits as well as the erasable, nonvolatile memory, in which data to be programmed is transferred into the control device from an external electronic device and a programming module for programming the erasable, nonvolatile memory is executed in the at least one central processing unit.

According to the invention, the method comprises the steps of dividing the erasable, nonvolatile memory into at least two separately erasable and programmable areas, providing at least one first area of the erasable, nonvolatile memory with an error-free programming module for programming the erasable, nonvolatile memory; providing an external electronic device with data to be programmed in the erasable, volatile memory; executing the error-free programming module for programming the erasable, nonvolatile memory under control of the at least one central processing unit, thereby receiving data to be programmed in the erasable, nonvolatile memory from an external electronic device; during the programming of the erasable, nonvolatile memory first programming a second area of the erasable, nonvolatile memory and thereby storing another programming module in this second area and thereafter programming the at least one first area with other programming module already stored in the second area.

The method according to the invention for completely reprogramming an erasable, non-volatile memory has by contrast the advantage that it is possible to dispense with providing an expensive, and above all subsequently unalterable, ROM with a programming module. The invention namely envisages that the programming module is provided additionally in the erasable, nonvolatile memory. Before the actual programming operation the programming module is then loaded into the volatile memory (code RAM) of the microcomputer and is then available there for execution. It is furthermore advantageous that the erasable, nonvolatile memory can also be reprogrammed completely and reliably at a later time. This makes it possible, for example in the case of a motor vehicle control device, for subsequent program changes to be made after delivery to the customer without having to remove the motor vehicle control device, for example from the motor vehicle, and send it back to the manufacturers. This is also advantageous because sometimes program changes only arise after the motor vehicle control device has been used in the field. For example it is possible that it is only established once a motor vehicle has been used in the field that the engine does not run smoothly in certain climatic conditions, so that a better setting of the engine becomes necessary for these circumstances. For this, however, the control program of the engine Control device must be modified. With the invention, it is now even possible to exchange the control program of a motor vehicle control device completely without any problem. The programming method is designed here in such a way that it can be performed with simple means so that the reprogramming of the non-volatile erasable memory can also be performed in the workshop. All that is required for this is a small computer, for example a PC, which is connected via the diagnostics interface of the motor vehicle to the respective motor vehicle control device. The new program data can be supplied on diskette, for example, to the workshop. These data are then transferred via the small computer and the diagnostics interface to the control device. It is likewise advantageous that the programming is designed to be fault-tolerant. Even a serious operating error, for example if the voltage supply from the motor vehicle or from the terminal were to be interrupted as a result of an operating error before the programming operation was completed, does not make programming impossible. The programming module is namely provided quasi duplicated in the programmable non-volatile memory, so that even if one of these programming modules were to be erased, the memory would still contain an intact programming module. The programming operation can then be continued with this intact programming module. Another advantage of storing the programming module in the non-volatile erasable memory is conferred by the fact that this then allows the manufacturer of the control device to develop his own programming module. The mode of operation of this programming module does not need to be made known to the public to any great extent. This makes any subsequent impermissible tampering with the non-volatile erasable memory more difficult.

Advantageous further developments and improvements of the method stated in the main claim are possible by virtue of the measures set out in the subclaims. The programming module itself can consist of individual modules. It is highly advantageous if only some of the modules of the programming module are written into the erasable, non-volatile memory and the remaining modules are subsequently loaded into the volatile memory from the external electronic device. This saves memory space in the erasable, non-volatile memory. It is particularly advantageous if the correctness of the memory contents of the memory area containing the programming module is checked before the actual programming operation and an area is reprogrammed only if a programming module identified as error-free is contained in the other area. This is a further safeguard for the programming operation.

The check can be performed in a particularly simple manner by adding the memory contents of the memory areas containing the programming module to form a checksum, which is compared with a value likewise entered in the erasable, non-volatile memory and the memory contents are identified as error-free if the calculated checksum matches the entered value.

It is furthermore advantageous, after each of the at least two areas have been programmed, to check whether the memory contents of these areas are error-free, and to program the next area only if the previously programmed area is identified as error-free. This is also a further safeguard for the programming method.

For the sake of simplicity, the programming module can be written together with the control program for the control device at the end of the production line for the control device into each of the at least two areas of the erasable, non-volatile memory.

In order to save memory space, it is however also possible to write the programming module into only one of the areas of the electrically erasable, non-volatile memory at the end of the production line for the control device and to write the programming module into the at least one further area only before the area in which a programming module is already entered is erased.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

The invention relates to the field of motor vehicle control devices. These serve to control, for example, engines, gears, brakes, etc. These control devices contain microcomputers which execute control programs in each case. When these control devices are used in the field, that is once the control devices have been built into motor vehicles and these have in turn been delivered to private customers, in some circumstances problems may arise that were not previously anticipated during development. Thus, for example, an engine bucking that is unpleasant for the customer can occur in a particular r.p.m. range of the engine which was previously tolerated by the developers, for example in order to optimize fuel consumption. In order to stop this engine bucking, it would be necessary to change the control program of the engine control device. For example, a richer mixture would have to be set in the r.p.m. range concerned. Other modification wishes could subsequently arise as well. The manufacturer of the motor vehicle would therefore wish the control devices to be designed in such a way that they can still be completely reprogrammed even after manufacture. The reprogramming should be possible in a workshop with simple means. The invention offers a solution for this.

Figure 1:
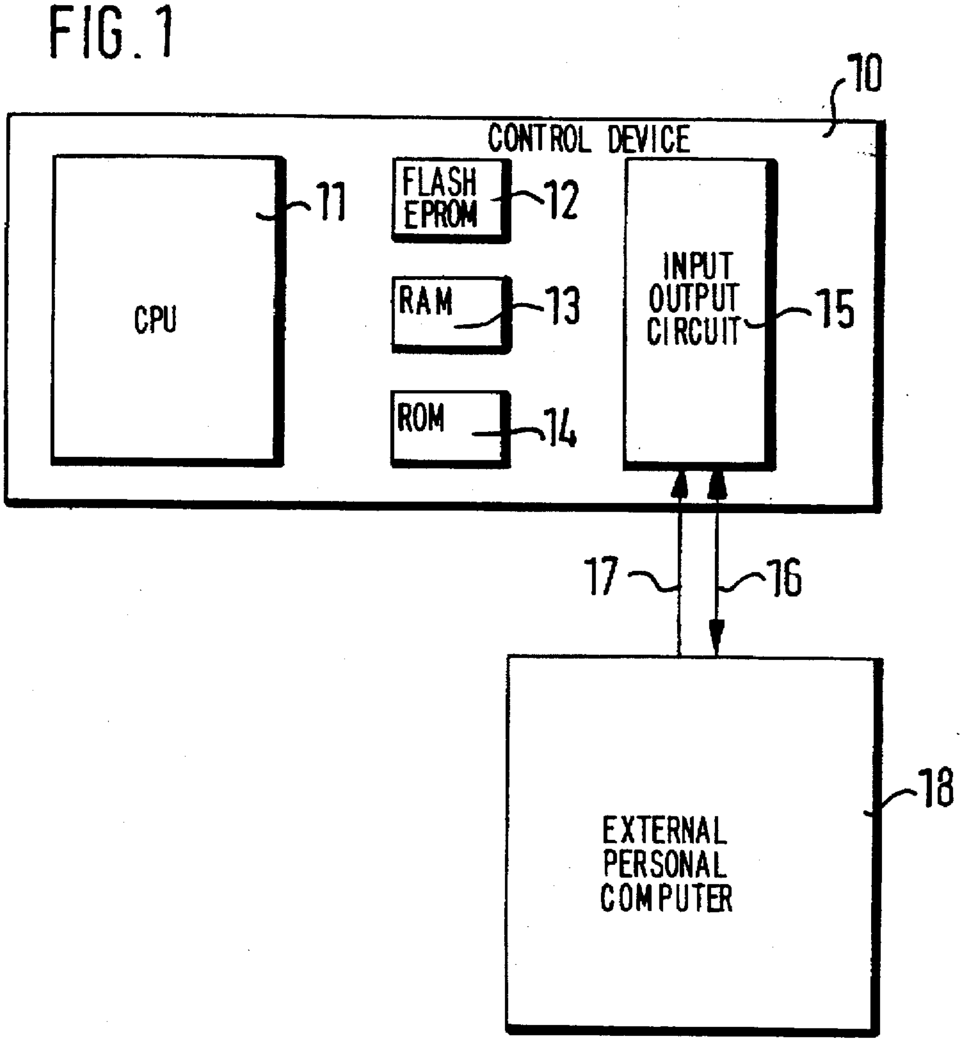
FIG. 1 is a block diagram of the control device with the external programming device used in one embodiment of the method according to the invention.

In FIG. 1, reference numeral 10 denotes a motor vehicle control device. The latter contains a central processing unit 11, an erasable, non-volatile memory 12, a volatile memory (RAM) 13, a read-only memory 14 and also various input/output circuits 15. The erasable, non-volatile memory 12 can be advantageously designed as a flash-EPROM. This type of memory namely enables a high memory density and non-volatility, as well as the capability for electrically erasing the memory contents. A special feature of the volatile memory 13 is that it is possible to write into it, or at least into a part of it, program data which the CPU can access directly. The read-only memory 14 is known as ROM. The control device 10 is connected via a serial transmission line 16 to a personal computer 18. The programming voltage for programming the erasable, non-volatile memory 12 is supplied to the control device 10 via the separate line 17.

Figure 2:
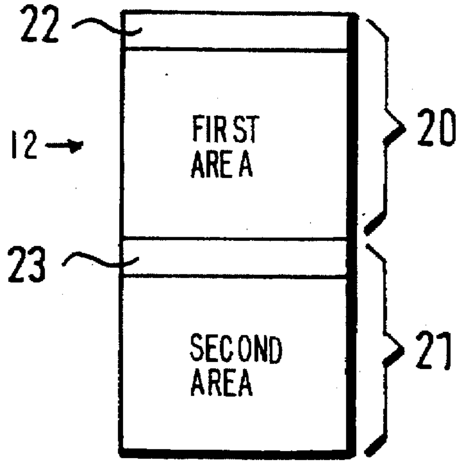
FIG. 2 is a diagram of an erasable, non-volatile memory from the device shown in FIG. 1 showing various memory areas.

A special feature of flash-EPROMs is that they permit only block-by-block erasing of the entire memory contents. FIG. 2 illustrates the erasable, non-volatile memory 12 with two areas that can be erased and programmed separately from each other. The memory division is selected in such a way that the two areas 20 and 21 are of equal size. During a read access of the central processing unit 11 to the flash-EPROM, access is random so that the control device program may be divided over the two areas 20, 21.

Figure 3:
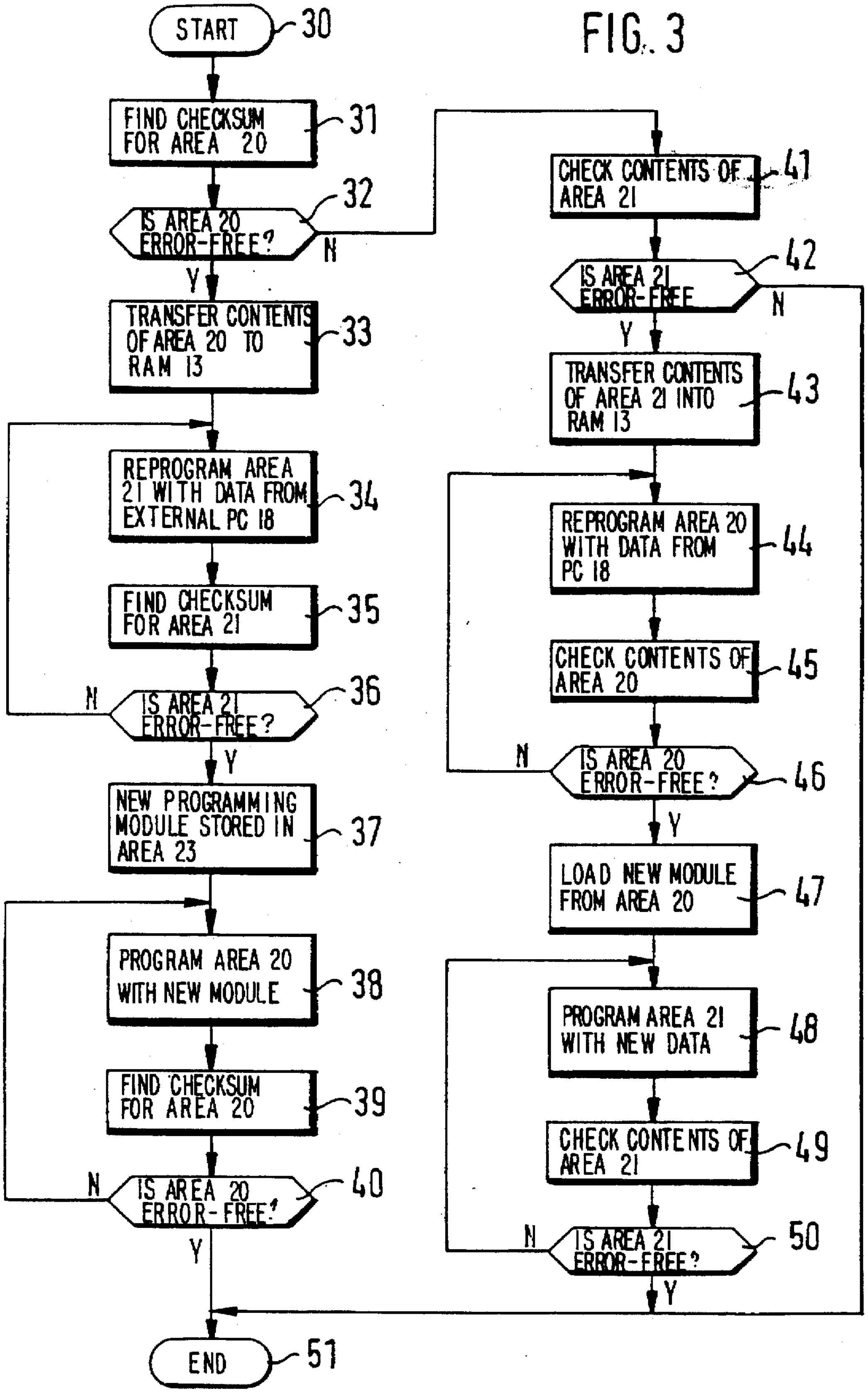
FIG. 3 is a flow chart showing the steps in one embodiment of the method of completely reprogramming the erasable, nonvolatile memory according to the invention.

During the manufacture of the motor vehicle control device 10, the erasable, non-volatile memory 12 was written with the control program. In addition, an identical programming module was written into each of the memory areas 20, 21. Said programming modules are written into the memory areas 22 and 23, which are illustrated in FIG. 2. The arrangement according to FIG. 1 is used to reprogram the memory 12. The personal computer 18 is therefore connected via the serial data transmission line 16 to the motor vehicle control device 10. The programming voltage is also applied to the control device 10 via a separate connection line 17. For programming, the new data, which are provided by the manufacturer on a data carrier such as a diskette for example, are input into the personal computer 18. After the control device 10 has been switched into the programming mode by the application of specific signals, the data are then successively transferred from the personal computer 18 to the motor vehicle control device 10. The actual procedure for programming the memory 12 will be described below with reference to the flowchart in FIG. 3.

The start of the programming operation is denoted by reference numeral 30. The central processing unit 11 then executes a part of the program in which the memory area 20 is subjected to a check. The CPU 11 here calculates a checksum for this memory area the step indicated by the reference numeral 31. This value is then compared with a value which is likewise stored in this area. In interrogation 32, the CPU 11 therefore determines whether the memory contents of the memory area 20 are error-free or not. In the text below it is initially assumed that the result of checking the memory area 20 was that the data written there are error-free. In program step 33 the memory contents of the memory area 20 are then transferred into the volatile memory 13 and the programming module stored therein is started. The programming module is then a program that is largely known per se from the prior art. For example, communication with the personal computer 18 takes place under the control of this program. The essential point is that, likewise under the control of this program, the memory area 21 is erased in program step 34 and is subsequently reprogrammed with the new data received from the personal computer 18. After the memory area 21 has been programmed, this area is then checked in program step 35. Again, the check can likewise be performed in such a way that a checksum is calculated over the memory area 21 which is compared with a checksum received from the personal computer. If the programming was faulty, this will be detected in interrogation 36 and the memory area 21 will be programmed again. This is followed by program steps 34 and 35 again. If programming was successful, in program step 37 a loading operation of the new programming module is then carried out, which is now entered into the volatile memory 13 in memory area 23. The new programming module is then started. After this the area 20 of the erasable, non-volatile memory 12 is programmed. In program step 38, the erasing and programming operation for this area 20 is carried out. This is done analogously to program step 34. It is however possible here for the programming routine to be actually improved in comparison with the original programming routine in program steps 34 (for example with respect to the programming time). The memory contents written into the area 20 are then checked in program step 39 as in program step 35. In interrogation 40, it is then checked by comparing the calculated checksum with the given checksum whether the area 20 has been programmed correctly. If this is not the case, then the programming operation is repeated. To do this program steps 38 and 39 are then executed again. If the programming operation was successful, then the entire memory 12 has been provided with new memory contents and the program for programming this memory is terminated in program step 51.

In the case where the memory contents of the area 20 were identified as faulty in interrogation 32, the memory contents of the area 21 are checked in program step 41. In interrogation 42, it is then decided whether the memory contents of the area 21 are error-free or not. If the memory contents of the area 21 are identified as faulty, then the entire programming operation is terminated with program step 51. If the memory contents of the area 21 are identified as error-free, then the data from memory area 21 as well as the programming module located in memory area 23 is loaded into the volatile memory 13 of the control device 10 and started. This takes place in program step 43 analogously to program step 33. The memory area 20 is then erased and reprogrammed in program step 44. This also takes place analogously to program step 34 or 38 respectively. The programming of the area 20 is then checked in program step 45. If the result of the check in interrogation 46 is that this area has not been programmed correctly, then the programming of this area 20 is repeated. To do this program steps 44 and 45 are repeated. If programming was successful, then in program step 47 the programming module that was newly written into the area 20 is loaded into the volatile memory 13 and started. During this execution, in program step 48 the area 21 is then erased and programmed with the new data. This area is checked again in program step 49. Here, too, programming is repeated if it was determined in interrogation 50 that there was an error during the preceding programming operation. If the programming operation was successful, then the entire memory contents of the memory 12 have been reprogrammed and the programming operation can be terminated in program step 51.

The invention is not restricted to the exemplary embodiment presented here. It can be varied in a large number of ways. For example, in order to save memory space in the erasable, non-volatile memory 12, it is possible to provide a programming module only in one area, for example in the first area 20, when the control device is manufactured, that is the first time the erasable, non-volatile memory 12 is programmed. In this case, however, before the area 20 is erased, the area 21 must be overwritten with the programming module from the area 20 in an intermediate step.

Moreover, a termination Criterion could be provided, for example in the program loops resulting from the negative decision branch in interrogations 36, 40, 46 and 50, which limits the number of loop passes to a specified value.

The programming module need not be written into the non-volatile erasable memory with all the modules of the programming module. In a variation of the exemplary embodiment, it is rather also possible to write only an important part, such as the module for communicating with the external electrical device, the module for checking the access authorization of the external electronic device and the module for loading the programming module into the volatile memory 13 for example, into the non-volatile erasable memory 12. The remaining parts of the programming module required could then simply be subsequently loaded into the volatile memory 13 from the external electronic device.

We claim:

1. A method for completely reprogramming an erasable, nonvolatile memory in a control device, said method comprising the steps of:

a) providing a control device (10) containing at least one central unit (11), a volatile memory (13), an erasable, nonvolatile memory (12) and input/output circuits (15), wherein said erasable, nonvolatile memory (12) comprises at least two separately erasable and programmable areas(20, 21) and at least one first area (20) of said at least two separately erasable and programmable areas (20, 21) includes an error-free programming module for programming the erasable, nonvolatile memory (12) stored therein;

b) providing an external electronic device (18) containing data to be programmed in the erasable, nonvolatile memory (12);

c) executing said programming module for programming of the erasable, nonvolatile memory (12) provided in step a) under control of the at least one central unit (11), thereby receiving said data in the erasable, nonvolatile memory from said external electronic device (18);

d) during said programming of the erasable, nonvolatile memory (12) in step c), first programming a second area (21) of said at least two areas (20, 21) of the erasable, nonvolatile memory (12) and thereby programming another programming module into said second area (21); and e) reprogramming said at least one first area (20) with said another programming module already stored in said second area (21).

2. The method as claimed in claim 1, further comprising transferring the programming module from the at least one first area (20) of the erasable, nonvolatile memory (12) to the volatile memory (13), and subsequently beginning the executing of the programming module in the volatile memory under control of the at least one central unit (11).

3. The method as claimed in claim 1, wherein the programming module comprises means for communicating with the external electronic device (18), means for checking access authorization of the external electronic device (18), means for loading the programming module into the volatile memory (13) and means for erasing and for programming the erasable, nonvolatile memory (12).

4. The method as claimed in claim 2, wherein the programming module includes at least two of means for communicating with the external electronic device (18), means for checking access authorization of the external electronic device (18), means for loading the programming module into the volatile memory (13) and means for erasing and for programming the erasable, nonvolatile memory (12); and further comprising writing each of said means not included in said programming module into the volatile memory (13) from the external electronic device (18).

5. The method as claimed in claim 1, further comprising calculating a checksum for checking the memory contents of the at least one first area (20), comparing the checksum with a value entered in the erasable, nonvolatile memory (12), and identifying said memory contents as error-free if the checksum matches the value entered in the erasable, nonvolatile memory (12).

6. The method as claimed in claim 1, further comprising checking one of said at least two separately erasable and programmable areas (20, 21) after said one of said at least two separately erasable and programmable areas (20, 21) has been programmed to determine if contents of said one of said at least two separately erasable and programmable areas (20, 21) are error-free, and only programming a next one of said at least two separately erasable and programmable areas (20, 21) if said contents of said one of said least two separately erasable and programmable areas (20, 21) are identified as error-free, and repeating the programming of said one of said at least two separately erasable and programmable areas (20, 21) if said contents of said one of said at least two separately erasable and programmable areas (20, 21) are not error-free.

7. The method as claimed in claim 1, further comprising storing a control program for the control device (10) together with the programming module into two of the at least two separately erasable and programmable areas (20, 21) of the erasable, nonvolatile memory (12), when said control device (10) is at an end of a production line for the control device (10).

8. The method as claimed in claim 1, further comprising storing the programming module into only one of said at least two separately erasable and programmable areas (20, 21) of the erasable, nonvolatile memory (12) when said control device (10) is at an end of a production line for the control device (10), and writing the programming module into another of the at least two separately erasable and programmable areas (20, 21) of the erasable, nonvolatile memory (12) before the programming module in the said one of said at least two separately erasable and programmable areas (20) is erased.

9. The method as claimed in claim 1, further comprising providing the control device with means for controlling a motor vehicle.

* * * * *